US007888253B2

(12) United States Patent
Usui et al.

(10) Patent No.: US 7,888,253 B2
(45) Date of Patent: Feb. 15, 2011

(54) METHOD OF FABRICATING SEMICONDUCTOR DEVICE

(75) Inventors: Takamasa Usui, Tokyo (JP); Tadayoshi Watanabe, Ibaraki (JP); Hayato Nasu, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 11/956,868

(22) Filed: Dec. 14, 2007

(65) Prior Publication Data

US 2008/0146015 A1 Jun. 19, 2008

(30) Foreign Application Priority Data

Dec. 18, 2006 (JP) .............................. 2006-340506

(51) Int. Cl.
H01L 23/48 (2006.01)
H01L 23/52 (2006.01)
H01L 29/40 (2006.01)

(52) U.S. Cl. ........................ 438/597; 257/751
(58) Field of Classification Search ................ 438/597
See application file for complete search history.

(56) References Cited

U.S. PATENT DOCUMENTS

| 6,607,982 | B1 | 8/2003 | Powell et al. |
| 6,664,185 | B1 | 12/2003 | Wang et al. |
| 6,730,594 | B2 | 5/2004 | Noguchi et al. |
| 6,890,846 | B2 | 5/2005 | Noguchi |
| 6,943,111 | B2 | 9/2005 | Lin et al. |
| 7,304,384 | B2 * | 12/2007 | Koike et al. ................. 257/751 |
| 2005/0218519 | A1 | 10/2005 | Koike et al. |

FOREIGN PATENT DOCUMENTS

| JP | 2002-329780 | 11/2002 |
| JP | 2005-277390 | 10/2005 |
| JP | 2006-73863 | 3/2006 |
| JP | 2006-179948 | 7/2006 |

OTHER PUBLICATIONS

T. Usui, et al., "Low Resistive and Highly Reliable Cu Dual-Damascene Interconnect Technology Using Self-Formed $MnSi_xO_y$ Barrier Layer", Proc. IEEE IITC, 2005, 3 pages.
T. Usui, et al., "High Performance Ultra Low-k ($k=2.0/k_{eff}=2.4$)/Cu Dual-Damascene Interconnect Technology with Self-Formed $MnSi_xO_y$ Barrier Layer for 32 nm-node", Proc. IEEE IITC, 2006, 3 pages.

* cited by examiner

*Primary Examiner*—Thanh V. Pham
*Assistant Examiner*—Mohammad Choudhry
(74) *Attorney, Agent, or Firm*—Oblon, Spivak, McClelland, Maier & Neustadt, L.L.P.

(57) ABSTRACT

A method of fabricating a semiconductor device according to an embodiment includes: forming a precursor film containing therein a predetermined metallic element on a surface of a recess portion formed in an insulating film on a semiconductor substrate; forming a wiring formation film on the precursor film; performing a heat treatment in an oxidation ambient atmosphere to cause the precursor film and the insulating film to react with each other, thereby forming a self-formed barrier film containing a compound, containing therein the predetermined metallic element and a constituent element of the insulating film, as a basic constituent in a boundary surface between the precursor film and the insulating film, and moving the predetermined metallic element unreacted into the wiring formation film through diffusion to cause the predetermined metallic element unreacted to react with oxygen contained in the oxidation ambient atmosphere on a surface of the wiring formation film, thereby precipitating an unreacted metallic oxide film including the predetermined metallic element; forming the same material as that of the wiring formation film on the wiring formation film after the unreacted metallic oxide film is removed; and flattening the wiring formation film until a portion of the insulating film located outside the recess portion is exposed.

8 Claims, 15 Drawing Sheets

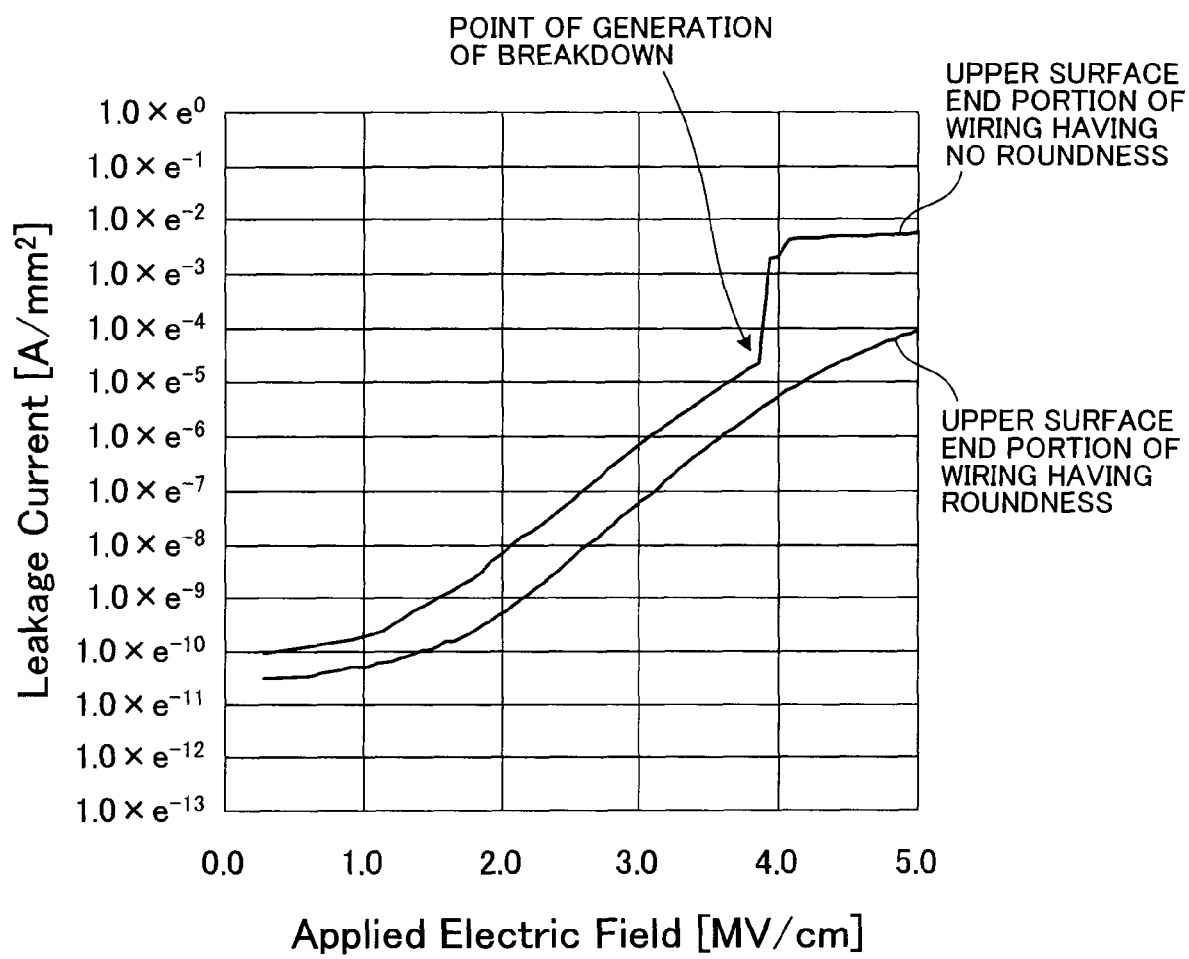

METHOD OF FABRICATING SEMICONDUCTOR DEVICE

CROSS-REFERENCE TO RELATED APPLICATIONS

This application is based upon and claims the benefit of priority from prior Japanese Patent Application No. 2006-340506, filed on Dec. 18, 2006, the entire contents of which are incorporated herein by reference.

BACKGROUND

A method of fabricating a semiconductor device having a wiring structure in which a barrier film for preventing diffusion of Cu is formed in a self-aligned manner between a wiring main body layer containing therein Cu as a basic constituent and an interlayer insulating film is known as a conventional method of fabricating a semiconductor device.

BRIEF SUMMARY

A method of fabricating a semiconductor device according to one embodiment includes: forming a precursor film containing therein a predetermined metallic element on a surface of a recess portion formed in an insulating film on a semiconductor substrate; forming a wiring formation film on the precursor film; performing a heat treatment in an oxidation ambient atmosphere to cause the precursor film and the insulating film to react with each other, thereby forming a self-formed barrier film containing a compound, containing therein the predetermined metallic element and a constituent element of the insulating film, as a basic constituent in a boundary surface between the precursor film and the insulating film, and moving the predetermined metallic element unreacted into the wiring formation film through diffusion to cause the predetermined metallic element unreacted to react with oxygen contained in the oxidation ambient atmosphere on a surface of the wiring formation film, thereby precipitating an unreacted metallic oxide film including the predetermined metallic element; forming the same material as that of the wiring formation film on the wiring formation film after the unreacted metallic oxide film is removed; and flattening the wiring formation film until a portion of the insulating film located outside the recess portion is exposed.

A method of fabricating a semiconductor device according to another embodiment includes: forming a precursor film containing therein a predetermined metallic element on a surface of a recess portion formed in an insulating film on a semiconductor substrate; forming a wiring formation film on the precursor film; performing a heat treatment to cause the precursor film and the insulating film to react with each other, thereby forming a self-formed barrier film containing a compound, containing therein the predetermined metallic element and a constituent element of the insulating film, as a basic constituent in a boundary surface between the precursor film and the insulating film, and diffusing the predetermined metallic element unreacted into the wiring formation film; reducing a thickness of the wiring formation film by removing a part of the wiring formation film after the self-formed barrier film is formed and the predetermined metallic element unreacted is diffused into the wiring formation film; performing a heat treatment in an oxidation ambient atmosphere, after the thickness of the wiring formation film is reduced, to cause the predetermined metallic element diffused into the wiring formation film to reactive with oxygen in the oxidation ambient atmosphere on a surface of the wiring formation film, thereby precipitating an unreacted metallic oxide film including the predetermined metallic element; and flattening the wiring formation film, until a portion of the insulating film located outside the recess portion is exposed, after the unreacted metallic oxide film is removed.

A method of fabricating a semiconductor device according to still another embodiment includes: forming a precursor film containing therein a predetermined metallic element on a surface of a recess portion formed in an insulating film on a semiconductor substrate; forming a wiring formation film on the precursor film; performing a heat treatment to cause the precursor film and the insulating film to react with each other, thereby forming a self-formed barrier film containing a compound, containing therein the predetermined metallic element and a constituent element of the insulating film, as a basic constituent in a boundary surface between the precursor film and the insulating film, and diffusing the predetermined metallic element unreacted into the wiring formation film; flattening the wiring formation film, until a portion of the insulating film located outside the recess portion is exposed, after the self-formed barrier film is formed and the predetermined metallic element unreacted is diffused into the wiring formation film; and performing a heat treatment in an oxidation ambient atmosphere, after the wiring formation film is flattened, to cause the predetermined metallic element diffused into the wiring formation film to react with oxygen in the oxidation ambient temperature on a surface of the wiring formation film, causing the reaction to progress to an inside of the self-formed barrier film to precipitate an unreacted metallic oxide film including the predetermined metallic element on an upper surface of the wiring formation film and a side surface near the upper surface of the wiring formation film, and rounding an end portion of the upper surface of the wiring formation film.

BRIEF DESCRIPTION OF THE DRAWING

FIG. 4 is a graph representing leakage current characteristics of the wiring structure in the semiconductor device fabricated by utilizing the method according to the third embodiment;

DETAILED DESCRIPTION

In each of embodiments which will be described below, a description will now be given with respect to a method of fabricating a semiconductor device having a dual damascene wiring structure in which wirings and vias are covered with a self-formed barrier film.

A wiring is made of a material containing therein Cu as a basic constituent (50 atomic % or more of the totality), and a self-formed barrier film is made of a material containing therein any one of $\alpha Si_xO_y$, $\alpha C_xO_y$, and $\alpha F_xO_y$ (x, y: real numbers), each containing therein a predetermined metallic element $\alpha$, as a basic constituent. Here, the predetermined metallic element $\alpha$ is any one of Mn, V, Zn, Nb, Zr, Cr, Y, Tc and Re.

In addition, a film containing therein the predetermined metallic element $\alpha$ is used as a precursor film for formation of the self-formed barrier film.

Note that, it is preferable that the predetermined metallic element $\alpha$ is Mn, the self-formed barrier film is made of $MnSi_xO_y$, and the precursor film is made of a CuMn alloy.

First Embodiment

FIGS. 1A to 1H are respectively cross sectional views showing processes for fabricating a wiring structure in a semiconductor device according to a first embodiment.

Figure 1A:
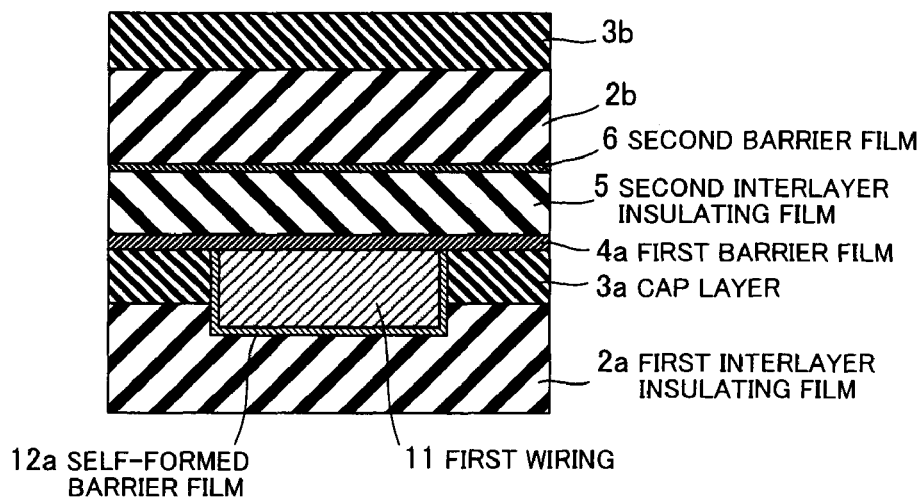
FIGS. 1A to 1H are respectively cross sectional views showing processes for fabricating a wiring structure in a semiconductor device according to a first embodiment.

Firstly, as shown in FIG. 1A, a first barrier film 4a, a second interlayer insulating film 5, a second barrier film 6, an upper first interlayer insulating film 2b, and a cap layer 3b are laminated in order on the first interlayer insulating film 2a and a cap layer 3a in which a first wiring 11, having a side surface and a bottom surface covered with a self-formed barrier film 12a, is formed.

Here, each of the first interlayer insulating films 2a and 2b can be formed of an organic insulating film, having a low relative permittivity, such as polyarylenether (PAr). The first interlayer insulating film 2b on the second barrier film 6, for example, has a thickness of 50 nm.

Each of the cap layers 3a and 3b can be formed of an inorganic insulating film which is made of $SiO_2$ or the like, and which, for example, has a thickness of 50 to 80 nm.

The first barrier film 4a can be formed of an inorganic insulating film which is made of SiCN, SiC or the like, and which, for example, has a thickness of 10 to 30 nm. It is noted that the first barrier film 4a serves to prevent diffusion of Cu contained in the first wiring 11, and also functions as an etching stopper in a phase of formation of the wiring.

The second interlayer insulating film 5 can be formed of an inorganic insulating film which is made of SiOC or the like, and which, for example, has a thickness of 50 nm.

The second barrier film 6 can be formed of an inorganic insulating film which is made of SiOC or the like and which, for example, has a thickness of 10 nm. It is noted that the second barrier film 6 functions as an etching stopper in the phase of formation of the wiring.

Note that, when the self-formed barrier film 12b formed in a subsequent process is made of $\alpha Si_xO_y$, the first barrier film 4a, the second interlayer insulating film 5, the second barrier film 6, the first interlayer insulating film 2b, and the cap layer 3b may be formed of insulating films each containing therein Si, respectively. In addition, when the self-formed barrier film 12b is made of either $\alpha C_xO_y$ or $\alpha F_xO_y$, the first barrier film 4a, the second interlayer insulating film 5, the second barrier film 6, the first interlayer insulating film 2b, and the cap layer 3b may be formed of insulating films each containing therein either C or F.

Figure 1B:
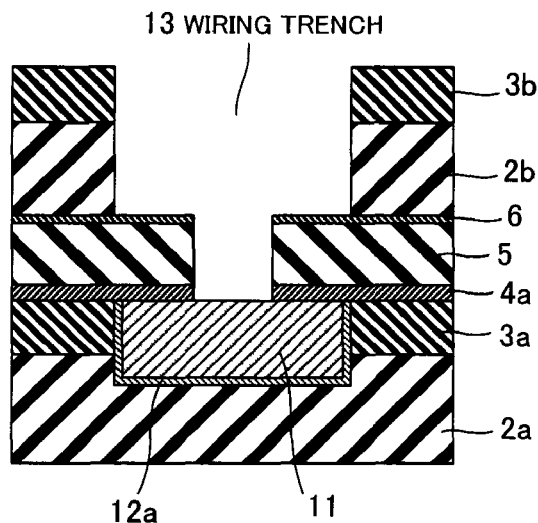

Next, as shown in FIG. 1B, a wiring trench (recess portion) 13 for formation of a second wiring 17 and a via 18 which will be described later by utilizing a suitable etching method.

Figure 1C:
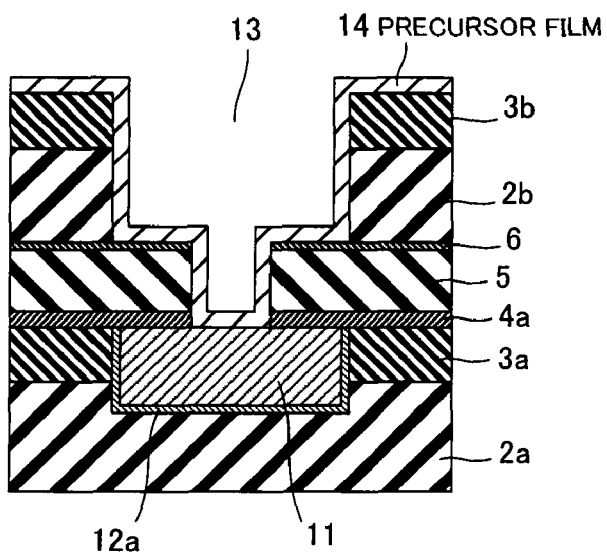

Next, as shown in FIG. 1C, a precursor film 14 is formed by a sputtering method, a chemical vapor deposition (CVD) method or the like so as to cover portions of the first barrier film 4a, the second interlayer insulating film 5, the second barrier film 6, the first interlayer insulating film 2b, and the cap layer 3b which are exposed from the wiring trench 13.

Here, the precursor film 14, for example, is made of a CuMn alloy (having an Mn concentration of 4 to 10 atomic %) which has a thickness of 20 to 90 nm.

Figure 1D:
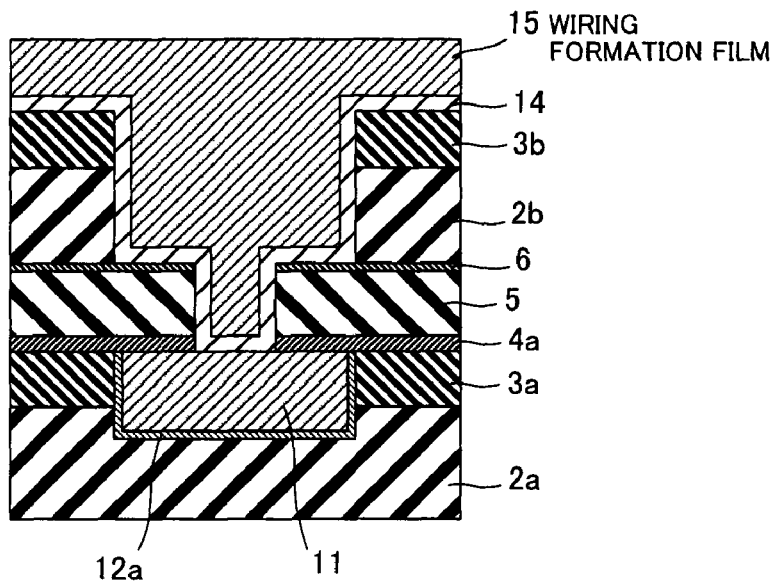

Next, as shown in FIG. 1D, a wiring formation film 15 is deposited on the precursor film 14 by a suitable plating method using the precursor film 14 as a seed layer, the CVD method or the like.

Here, the wiring formation film 15, for example, is made of Cu which has a thickness from a surface of the precursor film 14 on the cap layer 3b falling in the range of 10 to 110 nm.

Figure 1E:
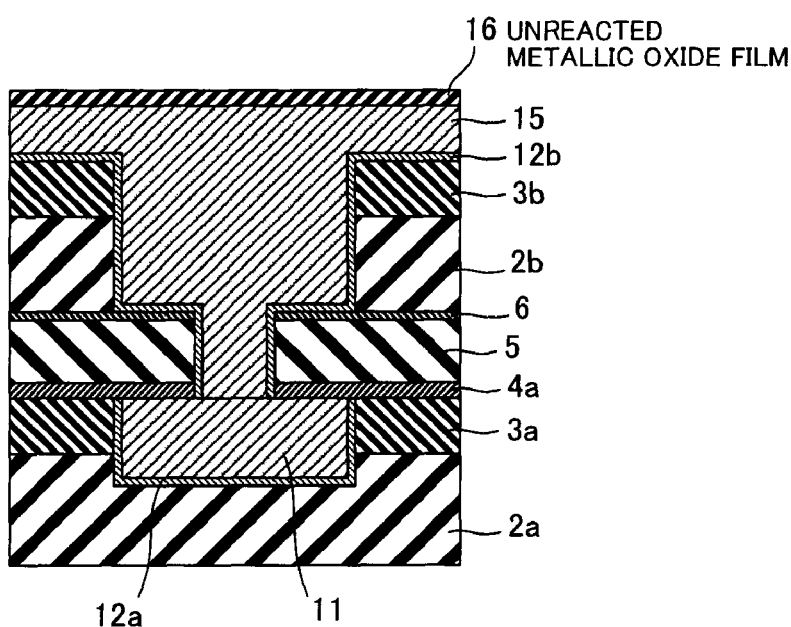

Next, as shown in FIG. 1E, a heat treatment, for example, is performed at 200 to 400° C. for 5 to 60 minutes in an oxidation ambient atmosphere, which results in that the precursor film 14 reacts with each of the first barrier film 4a, the second interlayer insulating film 5, the second barrier film 6, the first interlayer insulating film 2b, and the cap layer 3b, so that the self-formed barrier film 12b is formed in a self-aligned manner. At this time, when a thickness, of the wiring formation film 15, from the surface of the precursor film 14 on the cap layer 3b is not smaller than 10 nm, cohesion of the wiring formation film 15 due to the heat treatment hardly occurs.

On the other hand, predetermined metallic elements $\alpha$ unreacted within the precursor film 14 diffuse into and move within the wiring formation film 15, so that an unreacted metallic oxide film 16, including predetermined metallic elements $\alpha$, precipitates on the surface of the wiring formation film 15. At this time, when a thickness, of the wiring formation film 15, from the surface of the precursor film 14 on the cap layer 3b exceeds 110 nm, a precipitation of the unreacted predetermined metallic elements $\alpha$ may not progress and thus a large quantity of unreacted predetermined metallic element $\alpha$ may remain in the wiring formation film 15 because of an increase in distance of the movement of the predetermined metallic elements $\alpha$ to the surface of the wiring formation film 15.

When the precursor film 14 is made of a CuMn alloy, and the self-formed barrier film 12b is made of $MnSi_xO_y$, an $MnSi_xO_y$ film having a thickness of about 2 to about 10 nm is formed in the form of the self-formed barrier film 12b from Mn contained in the precursor film 14, and Si and O contained in each of the second interlayer insulating film 5, the second barrier film 6, the cap layer 3b and the like. It is noted that Cu contained in the precursor film 14 diffuses into the wiring formation film 15.

In addition, unreacted Mn contained in the precursor film 14 diffuses into and moves within the wiring formation film 15, so that the unreacted metallic oxide film 16 precipitates in the form of an $MnO_x$ (x: a real number) film on the surface of the wiring formation film 15. In this case, about 0.04 atomic % Mn is contained in the wiring formation film 15 intended to become a Cu wiring. Thus, a specific resistance further increases in the wiring formation film 15 than in a wiring formation film containing therein no Mn by about 0.14 $\mu\Omega$/cm. The increase in specific resistance hardly becomes a problem in actual use. It is noted that when about 0.05 atomic % or less Mn is contained in the wiring formation film 15, an increase in specific resistance becomes no problem. In addition thereto, it is possible to obtain the high reliability against the electromigration and the stress voids because Mn impedes the movement of Cu.

Figure 1F:
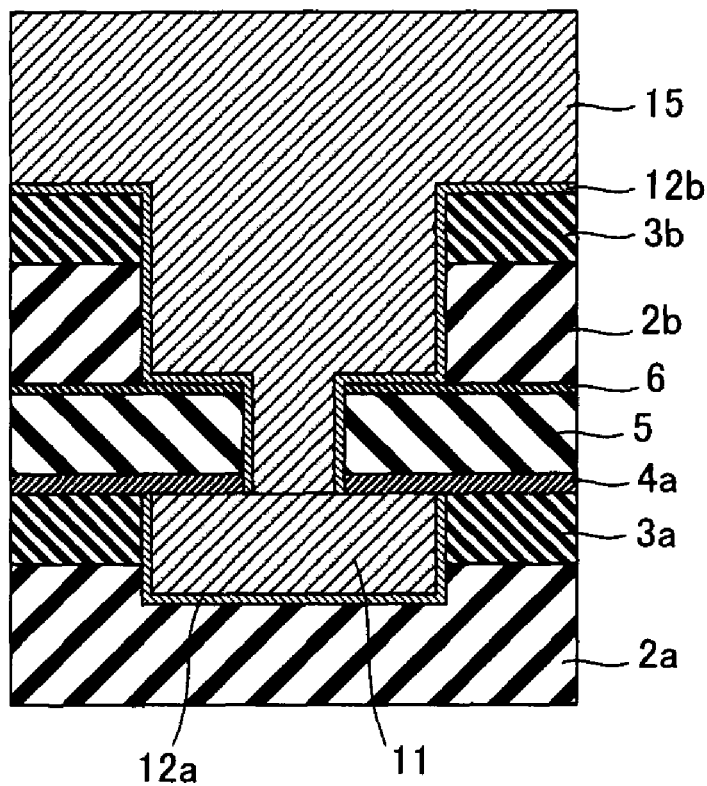

Next, as shown in FIG. 1F, the unreacted metallic oxide film 16 is removed by using an acid such as a hydrochloric acid, and the wiring formation film 15 is further formed so as to be stacked on the previous wiring formation film 15 by a suitable plating method, the CVD method or the like to have a thickness enough to permit chemical mechanical polishing (CMP) to be performed in a subsequent process, for example, to have up to the thickness of 0.8 to 1.5 μm. Note that, the thickness of the stacked wiring formation film 15 is preferably larger than that of the unreacted metallic oxide film 16 thus removed. The reason for this is because if the thickness of the stacked wiring formation film 15 is permitted to be smaller than that of the unreacted metallic oxide film 16, the wiring formation film 15 does not have the thickness enough to permit the CMP to be performed even after the wiring formation film 15 is stacked on the previous wiring formation film 15.

Figure 1G:
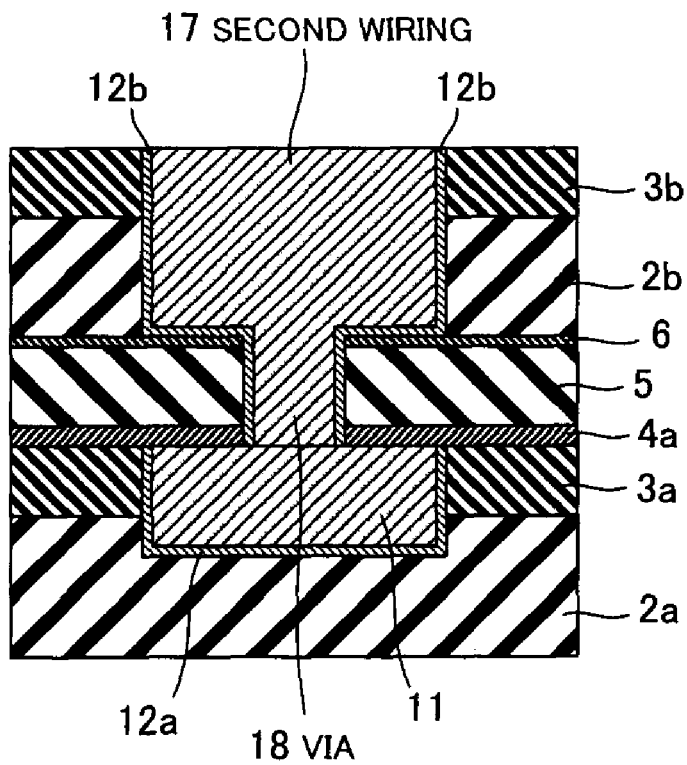

Next, as shown in FIG. 1G, by performing the CMP with the cap layer 3b as a stopper, the wiring formation film 15 is flattened until the cap layer 3b is exposed, thereby forming a second wiring 17, and a via 18 through which the first wiring 11 and the second wiring 17 are connected to each other. In addition, the self-formed barrier film 12b formed on the cap layer 3b is removed through the CMP process.

Figure 1H:
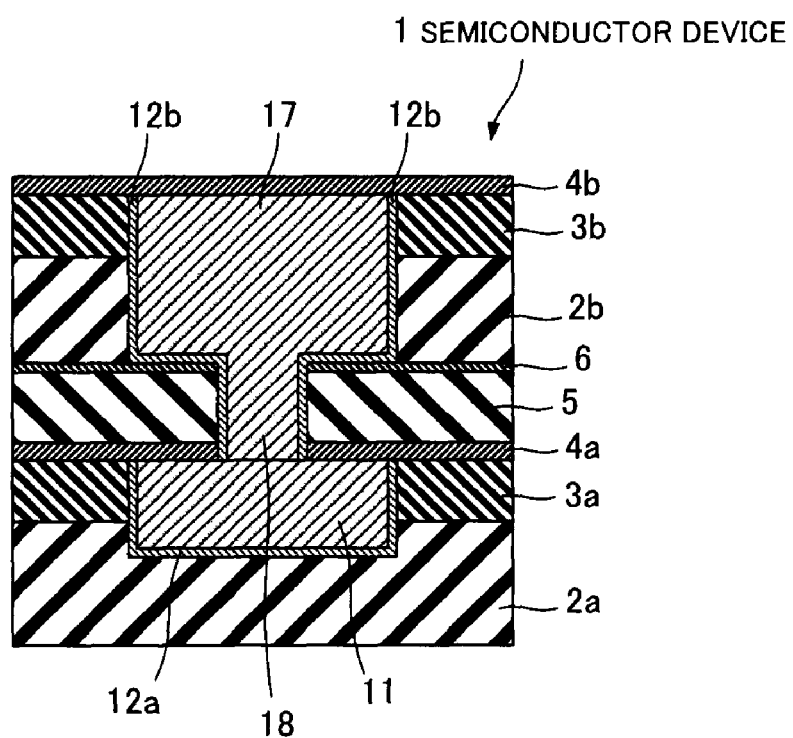

Next, as shown in FIG. 1H, the first barrier film 4b is formed on the second wiring 17 and the cap layer 3b. While not illustrated in the figure, an insulating film and the like are formed as upper layers, thereby forming a semiconductor device 1.

According to the first embodiment, the unreacted metallic oxide film 16 is precipitated after the wiring formation film 15 is formed so that its thickness from the surface of the precursor film 14 on the cap layer 3b falls in the range of 10 to 110 nm, which results in that the quantity of unreacted predetermined metallic element α remaining in the wiring formation film 15 can be suppressed, and thus it is possible to obtain the high reliability against the electromigration and the stress voids without hardly increasing the specific resistance of the second wiring 17.

It is noted that the first wiring 11 can be formed in the same manner as that for the second wiring 17.

Second Embodiment

A second embodiment is different from the first embodiment in that the unreacted metallic oxide film 16 is precipitated after the wiring formation film 15 is flattened through the CMP process. Note that, the same respects, such as the constitutions and the like of other portions, as those in the first embodiment are omitted here in their descriptions for the sake of simplicity.

FIGS. 2A to 2F are respectively cross sectional views showing processes for fabricating a wiring structure in a semiconductor device according to the second embodiment.

Firstly, there is performed up to the process for forming the precursor film 14 as shown in FIG. 1C in the first embodiment.

Figure 2A:
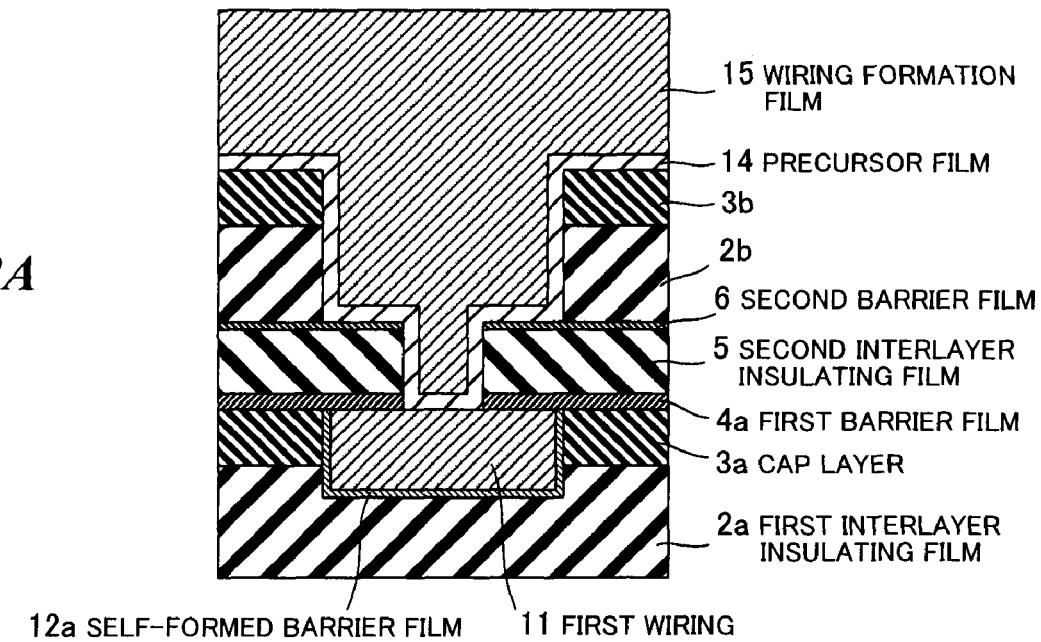
FIGS. 2A to 2F are respectively cross sectional views showing processes for fabricating a wiring structure in a semiconductor device according to a second embodiment.

Next, as shown in FIG. 2A, the wiring formation film 15 is deposited on the precursor film 14 by utilizing the suitable plating method, the CVD method or the like using the precursor film 14 as a seed layer. Here, the wiring formation film 15 is formed to have a thickness enough to permit the CMP to be performed in the subsequent process, for example, to have a thickness from the surface of the precursor film 14 on the cap layer 3b falling in the range of 1 to 1.5 μm.

Figure 2B:
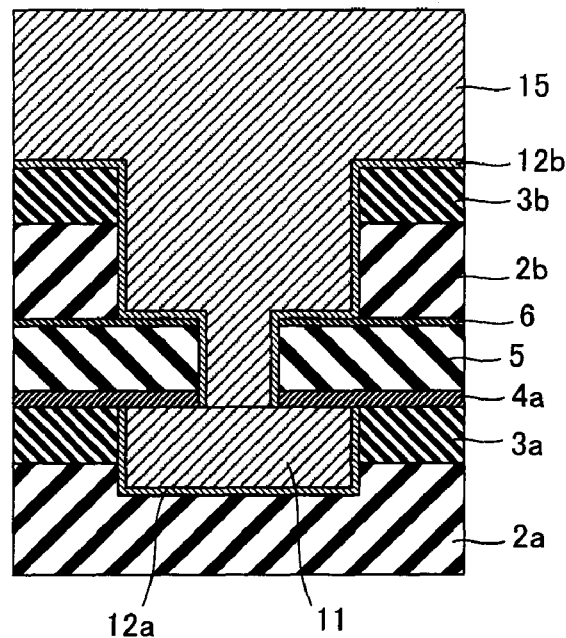

Next, as shown in FIG. 2B, a heat treatment, for example, is performed at 200 to 400° C. for 5 to 60 minutes, preferably, in a reduction ambient atmosphere, which results in that the precursor film 14 reacts with each of the first barrier film 4a, the second interlayer insulating film 5, the second barrier film 6, the first interlayer insulating film 2b, and the cap layer 3b to turn into the self-formed barrier film 12b. It is noted that at this time point, the unreacted predetermined metallic elements α which are contained in the precursor film 14 is in a state of diffusing into the wiring formation film 15, and thus does not yet precipitate in the form of the unreacted metallic oxide film 16. Although the unreacted predetermined metallic elements α may be permitted to precipitate in the form of the unreacted metallic oxide film 16, it is difficult for a sufficient quantity of metallic element α to precipitate in the form of the unreacted metallic oxide film 16 because the wiring formation film 15 is too thick for the predetermined metallic elements α diffused into the wiring formation film 15 to efficiently move to the surface of the wiring formation film 15.

Figure 2C:
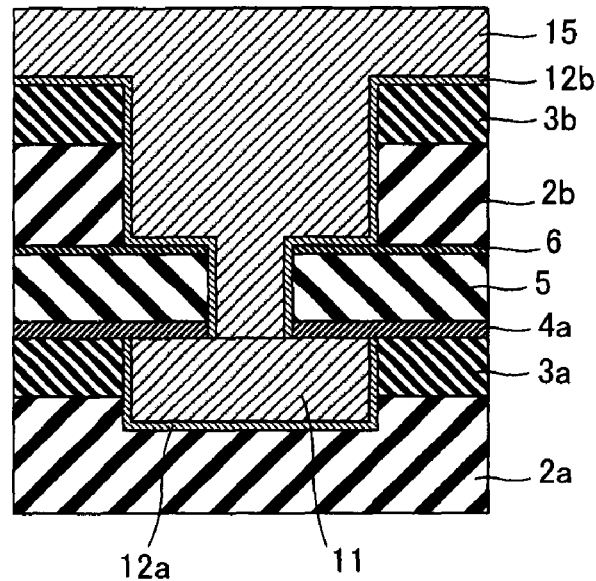

Next, as shown in FIG. 2C, the thickness of the wiring formation film 15 is reduced to the middle thereof through the CMP process. For example, the wiring formation film 15 is scraped until its thickness from the surface of the self-formed barrier film 12b on the cap layer 3b falls in the range of 10 to 110 nm.

Figure 2D:
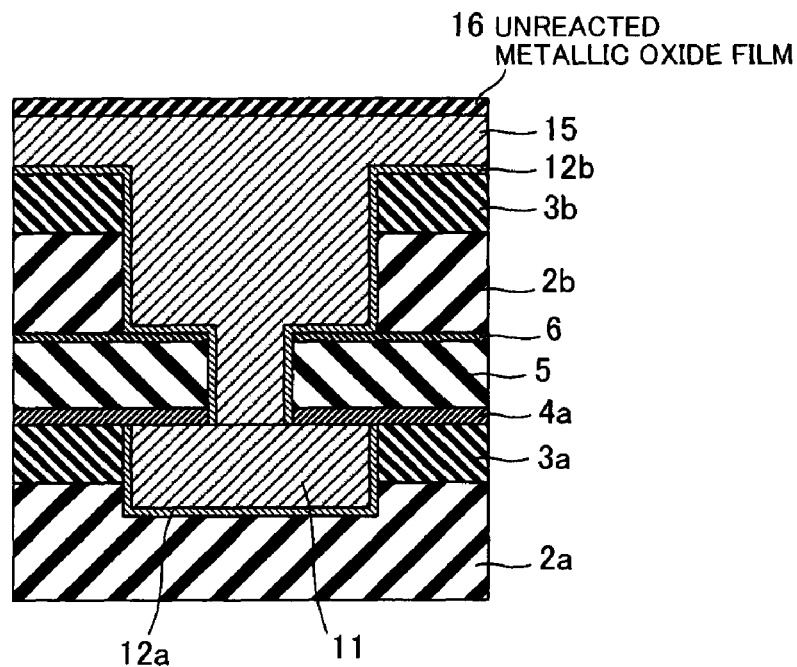

Next, as shown in FIG. 2D, a heat treatment, for example, is formed at 200 to 400° C. for 5 to 60 minutes in an oxidation ambient atmosphere, thereby precipitating the unreacted metallic oxide film 16 on the surface of the wiring formation film 15.

Figure 2E:
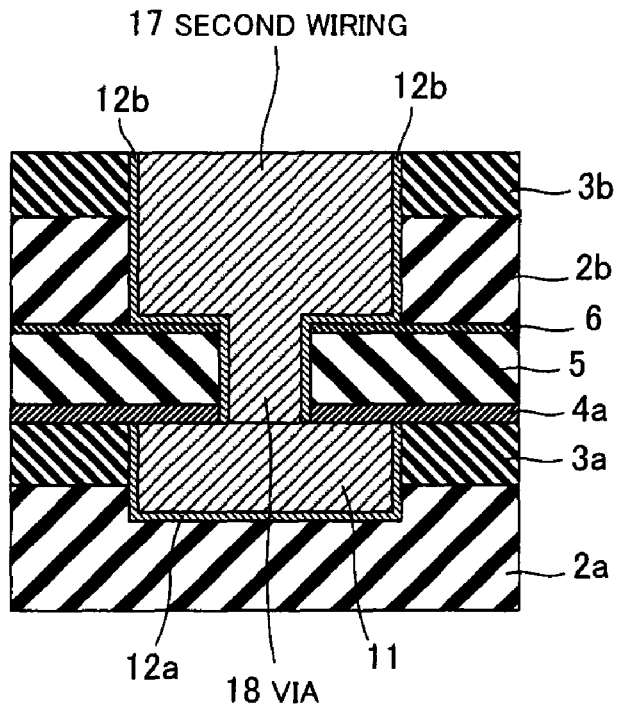

Next, as shown in FIG. 2E, after the unreacted metallic oxide film 16 is removed by using an acid such as a hydrochloric acid, the CMP is performed with the cap layer 3b as a stopper to flatten the wiring formation film 15 until the cap layer 3b is exposed, thereby forming the second wiring 17, and the via 18 through which the first wiring 11 and the second wiring 17 are connected to each other. In addition, the self-formed barrier film 12b on the cap layer 3b is removed through the CMP process.

Note that, at this time, by using an acidic CMP slurry, the removal of the unreacted metallic oxide film 16, and the flattening of the wiring formation film 15 can be continuously performed through the CMP process.

Figure 2F:
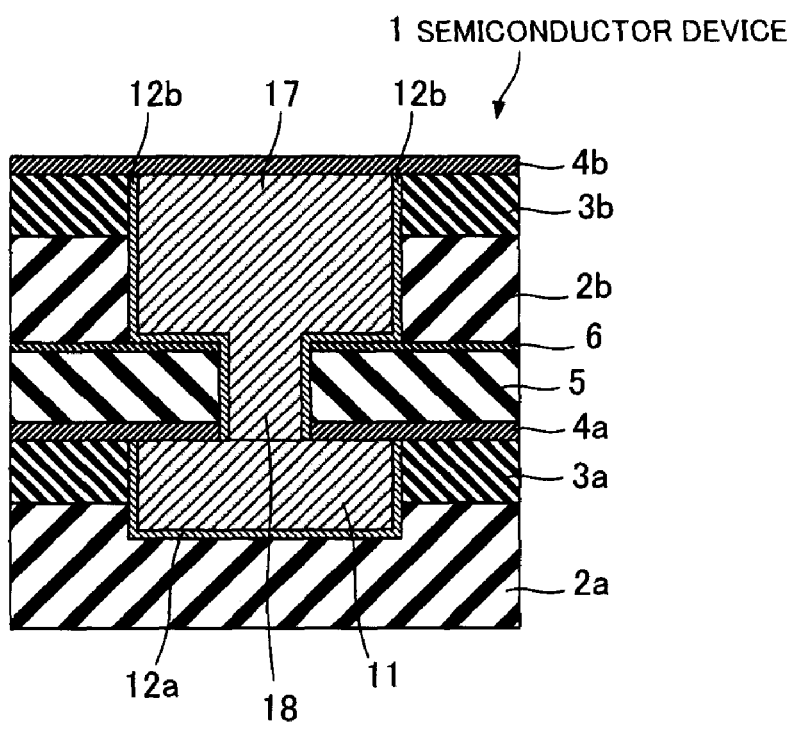

Next, as shown in FIG. 2F, the first barrier film 4b is formed on the second wiring 17 and the cap layer 3b. Moreover, while not illustrated in the figure, the insulating film and the like are formed as the upper layers, thereby forming the semiconductor device 1.

According to the second embodiment, although the different fabricating method is utilized, the same effects as those of the first embodiment can be obtained.

Third Embodiment

A third embodiment is different from the second embodiment in that the unreacted metallic oxide film 16 is precipitated after the CMP is performed for the wiring formation film 15 until the surface of the cap layer 3b is exposed. It is noted that the same respects, such as the constitutions and the like of other portions, as those in the second embodiment are omitted here in their descriptions for the sake of simplicity.

FIGS. 3A to 3D are respectively cross sectional views showing processes for fabricating a wiring structure in a semiconductor device according to the third embodiment.

Firstly, there is performed up to the process for forming the self-formed barrier film 12 to diffuse the unreacted predetermined metallic elements α into the wiring formation film 15 as shown in FIG. 2B in the second embodiment.

Figure 3A:
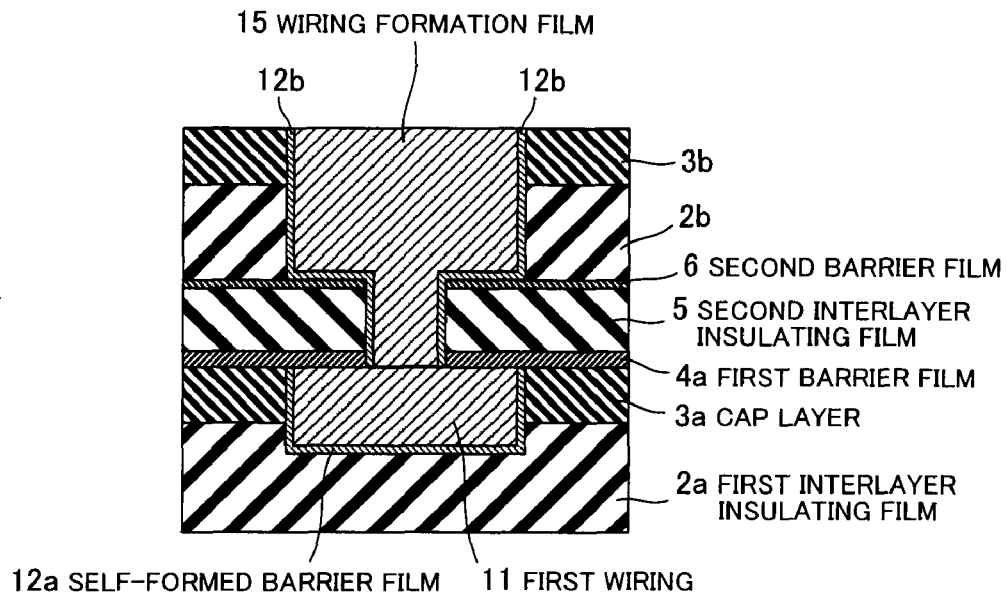
FIGS. 3A to 3D are respectively cross sectional views showing processes for fabricating a wiring structure in a semiconductor device according to a third embodiment.

Next, as shown in FIG. 3A, the CMP is performed with the cap layer 3b as the stopper to flatten the wiring formation film 15 until the cap layer 3b is exposed. In addition, the self-formed barrier film 12b on the cap layer 3b is removed through the CMP process.

Figure 3B:
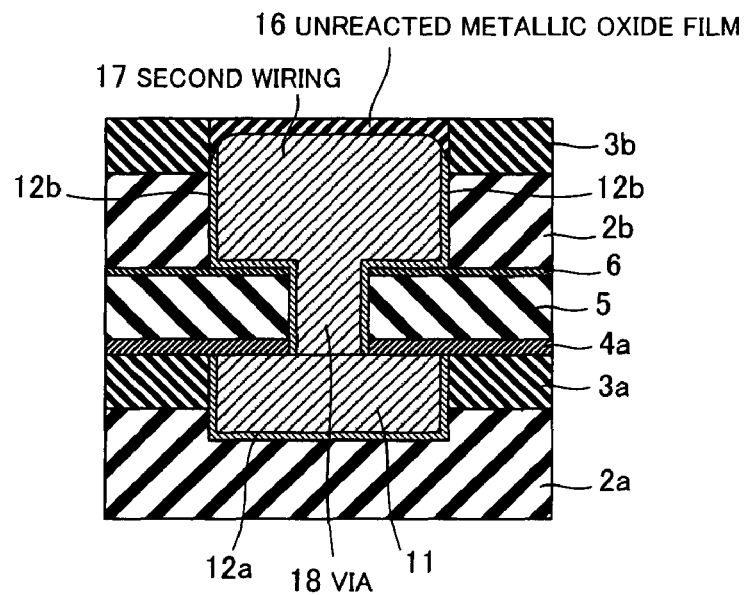

Next, as shown in FIG. 3B, the heat treatment, for example, is performed at 200 to 400° C. for 5 to 60 minutes in the oxidation ambient atmosphere, thereby precipitating the unreacted metallic oxide film 16 on the surface of the wiring formation film 15. At this time, since the self-formed barrier film 12b contains therein the predetermined metallic elements α and oxygen constituting the unreacted metallic oxide film 16, the reaction for formation of the unreacted metallic oxide film 16 progresses to the self-formed barrier film 12b. As a result, a peripheral portion of the unreacted metallic oxide film 16 has a shape of extending downward along the cap layer 3b.

When the unreacted metallic oxide film 16 is made of $MnO_x$, and the self-formed barrier film 12b is made of $MnSi_xO_y$, the reaction for formation of $MnO_x$ progresses to the inside of the self-formed barrier film 12b because the self-formed barrier film 12b contains therein Mn and O. As a result, the second wiring 17 having a rounded shape in its upper surface end portion, and the via 18 through which the first wiring 11 and the second wiring 17 are connected to each other are formed.

Figure 3C:
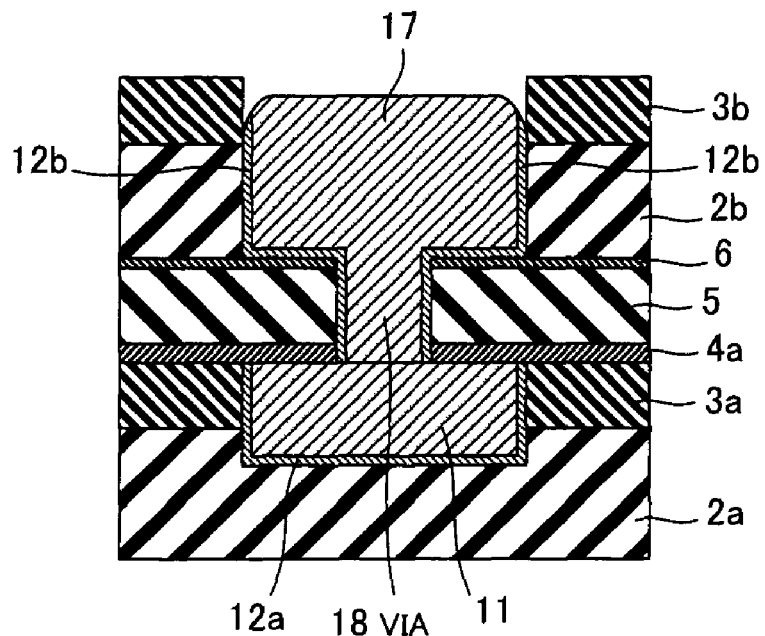

Next, as shown in FIG. 3C, the unreacted metallic oxide film 16 is removed by using an acid such as a hydrochloric acid.

Figure 3D:
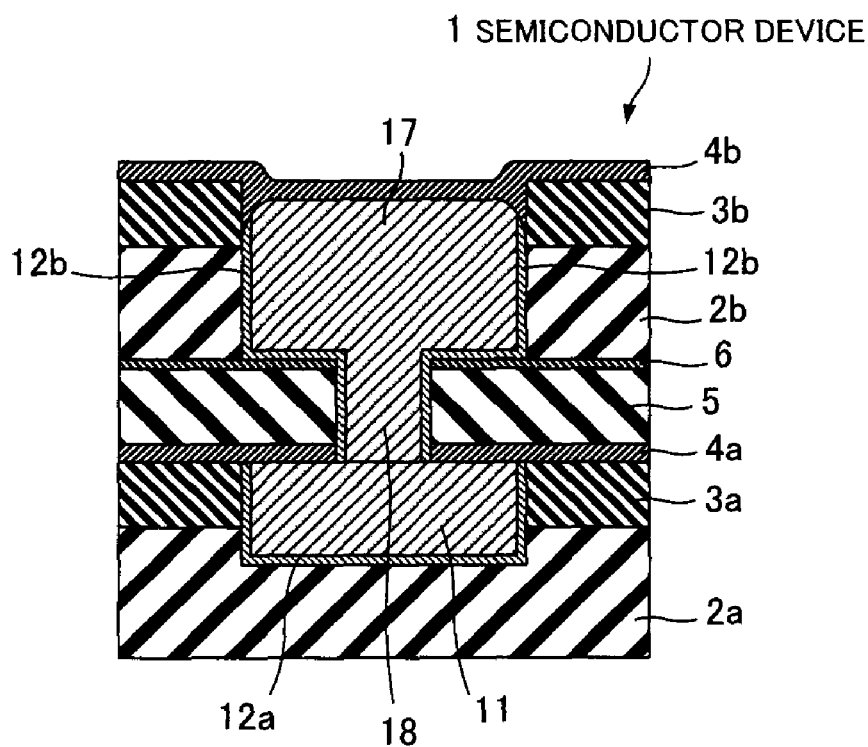

Next, as shown in FIG. 3D, the first barrier film 4b is formed on the second wiring 17 and the cap layer 3b. Moreover, while not illustrated in the figure, the insulating film and the like are formed as the upper layers, thereby forming the semiconductor device 1.

It is noted that the unreacted metallic oxide film 16 may not be removed because it is the insulating film. In this case, the first barrier film 4b is formed on the unreacted metallic oxide film 16.

According to the third embodiment, formation of the second wiring 17 having the rounded shape in its upper surface end portion makes it possible to suppress concentration of an electric field on the upper surface end portion. In addition, the upper surface of the second wiring 17 is made different in height from that of the cap layer 3b, thereby making it possible to reduce a leakage current.

It is noted that the first wiring 11 can be formed by utilizing the same method as that for the second wiring 17.

FIG. 4 is a graph representing leakage current characteristics of the wiring structure in the semiconductor device fabricated by utilizing the method of the third embodiment. In the figure, a lower curve represents the characteristics of the wiring having the rounded shape in its upper surface end portion fabricated by utilizing the method of the third embodiment, while an upper curve represents the characteristics of the conventional wiring having no rounded shape in its upper surface end portion. Each of the upper and lower curves represents a relationship between a magnitude of an electric field (plotted on an axis of ordinate in FIG. 4) occurring across the adjacent two wirings, and a magnitude of a leakage current (plotted on an axis of abscissa in FIG. 4).

As apparent from FIG. 4, the conventional wiring having no rounded shape in its upper surface end portion shows the characteristics in which a breakdown is generated when the magnitude of the electric field exceeds about 3.8 MV/cm, so that the magnitude of the leakage current rises suddenly. On the other hand, the wiring having the rounded shape in its upper surface end portion shows the characteristics in which the magnitudes of the leakage currents are generally smaller than those in the conventional wiring structure, and also no breakdown is generated within this measurement range.

Fourth Embodiment

A fourth embodiment is different from the third embodiment in that the unreacted metallic oxide film 16 is precipitated after the first barrier film 4b is formed on the wiring formation film 15. It is noted that the same respects, such as the constitutions and the like of other portions, as those in the third embodiment are omitted herein in their descriptions for the sake of simplicity.

Figure 5A:
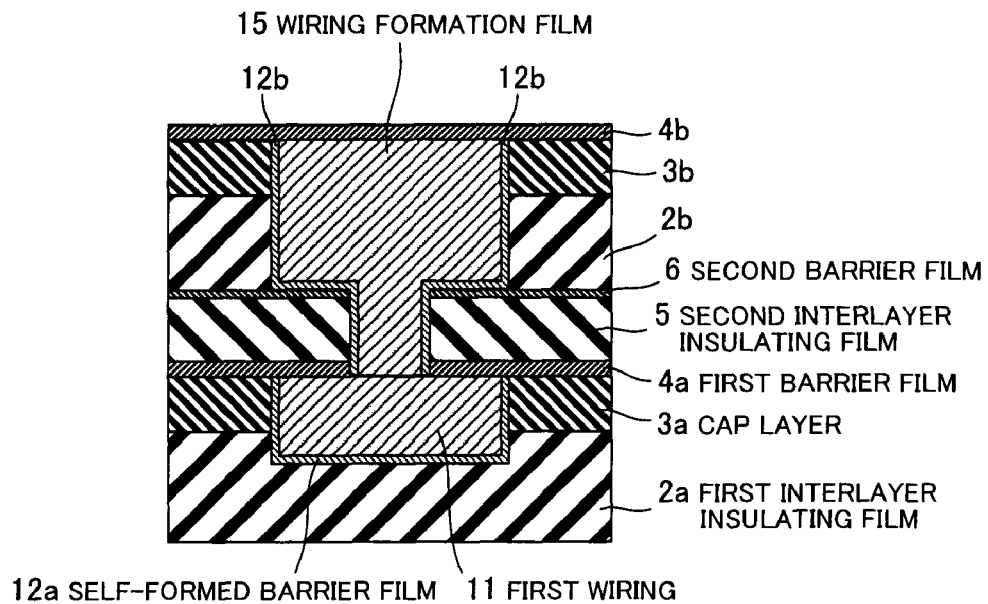
FIGS. 5A and 5B are respectively cross sectional views showing processes for fabricating a wiring structure in a semiconductor device according to a fourth embodiment.
Figure 5B:
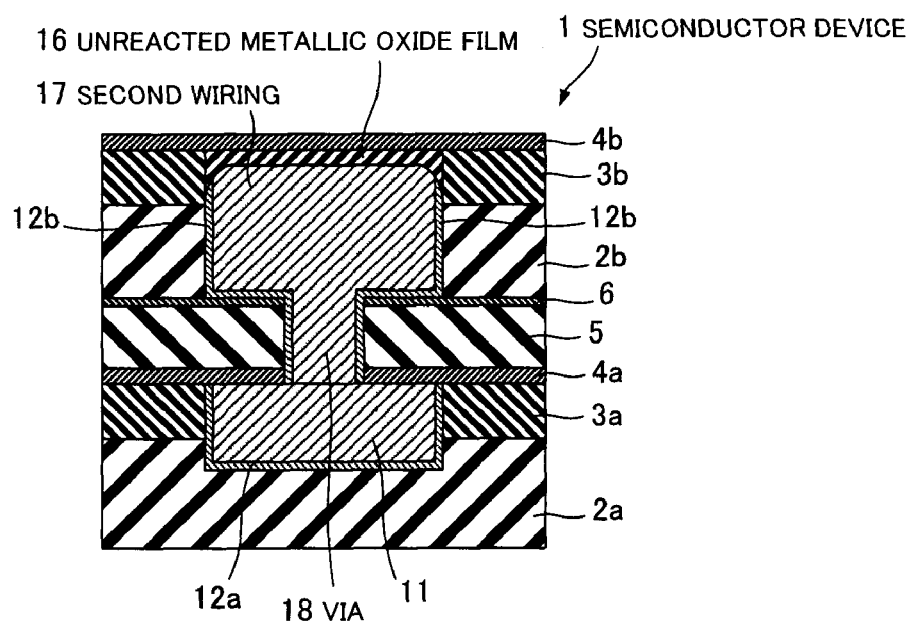

FIGS. 5A and 5B are respectively cross sectional views showing processes for fabricating a wiring structure in a semiconductor device according to the fourth embodiment.

Firstly, there is performed up to the process for performing the CMP for the wiring formation film 15 with the cap layer 3b as the stopper as shown in FIG. 3A in the third embodiment.

Next, as shown in FIG. 5A, the first barrier film 4b is formed on the wiring formation film 15 and the cap layer 3b.

Next, as shown in FIG. 5B, the heat treatment, for example, is performed at 200 to 400° C. for 5 to 60 minutes in the oxidation ambient atmosphere, thereby precipitating the unreacted metallic oxide film 16 on the surface of the wiring formation film 15. At this time, since the self-formed barrier film 12b contains therein the predetermined metallic elements α and oxygen constituting the unreacted metallic oxide film 16, the reaction for formation of the unreacted metallic oxide film 16 progresses to the self-formed barrier film 12b. As a result, the peripheral portion of the unreacted metallic oxide film 16 has a shape of extending downward along the cap layer 3. Moreover, while not illustrated in the figure, the insulating film and the like are formed as the upper layers, thereby forming the semiconductor device 1.

According to the fourth embodiment, although a different fabricating method is utilized, the same effects as those of the third embodiment can be obtained.

Fifth Embodiment

A fifth embodiment is different from the first or second embodiment in that the self-formed barrier film 12 is formed even on the upper surface of the second wiring 17. It is noted that the same respects, such as the constitutions and the like of other portions, as those in the first or second embodiment are omitted here in their descriptions for the sake of simplicity.

Figure 6:
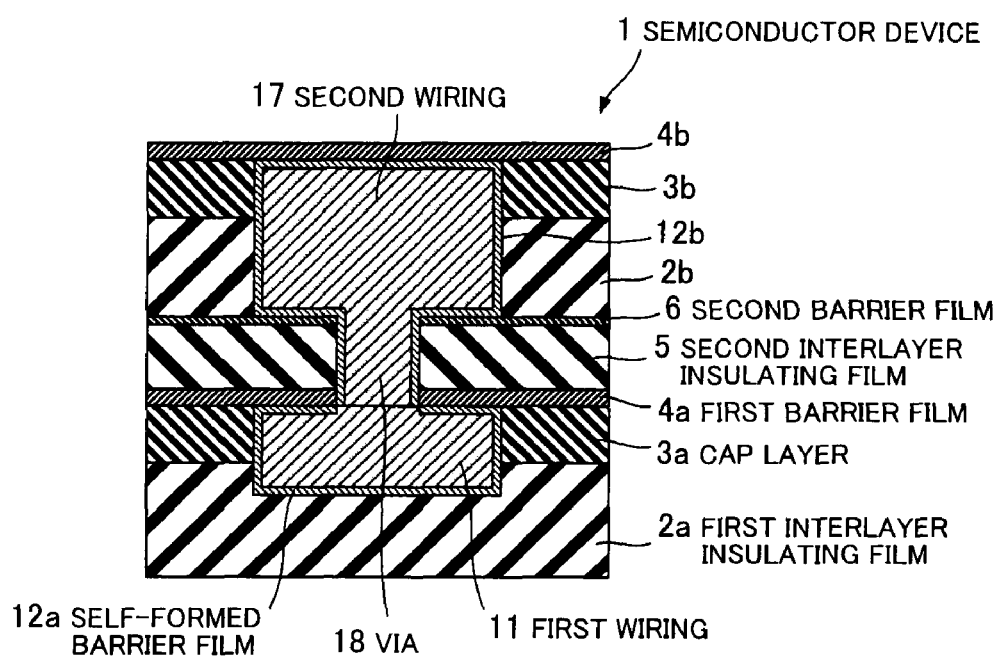
FIG. 6 is a cross sectional views showing a process for fabricating a wiring structure in a semiconductor device according to a fifth embodiment.

FIG. 6 is a cross sectional view showing a process for fabricating a wiring structure in a semiconductor device according to a fifth embodiment.

Firstly, there is performed up to the process for forming the first barrier film 4b on the second wiring 17 and the cap layer 3b as shown in FIG. 1H in the first embodiment or as shown in FIG. 2C in the second embodiment. However, in this embodiment, it is assumed that a quantity of predetermined metallic element α enough to permit the self-formed barrier film 12b to be formed on the upper surface of the second wiring 17 remains in the second wiring 17.

Next, as shown in FIG. 6, a heat treatment, for example, is performed at 200 to 400° C. for 5 to 60 minutes, preferably, in a reduction ambient atmosphere, which results in that a reaction occurs between the second wiring 17 and the first barrier film 4b on the second wiring 17, thereby forming the self-formed barrier film 12b on the upper surface of the second wiring 17.

When the self-formed barrier film 12b is made of $MnSi_xO_y$, the self-formed barrier film 12b is formed on the upper surface of the second wiring 17 from Mn remaining in the second wiring 17, and Si and O contained in the first barrier film 4b.

Moreover, while not illustrated in the figure, the insulating film and the like are formed as the upper layers, thereby forming the semiconductor device 1.

According to the fifth embodiment, forming the self-formed barrier film 12b even on the upper surface of the second wiring 17 makes it possible to further reduce the leakage current as compared with that in the first or second embodiment.

It is noted that the first wiring 11 can be formed by utilizing the same method as that for the second wiring 17.

Sixth Embodiment

A sixth embodiment is different from the third embodiment in that the self-formed barrier film 12b is formed even on the upper surface of the second wiring 17. It is noted that the same respects, such as the constitutions and the like of other portions, as those in the third embodiment are omitted here in their descriptions for the sake of simplicity.

Figure 7:
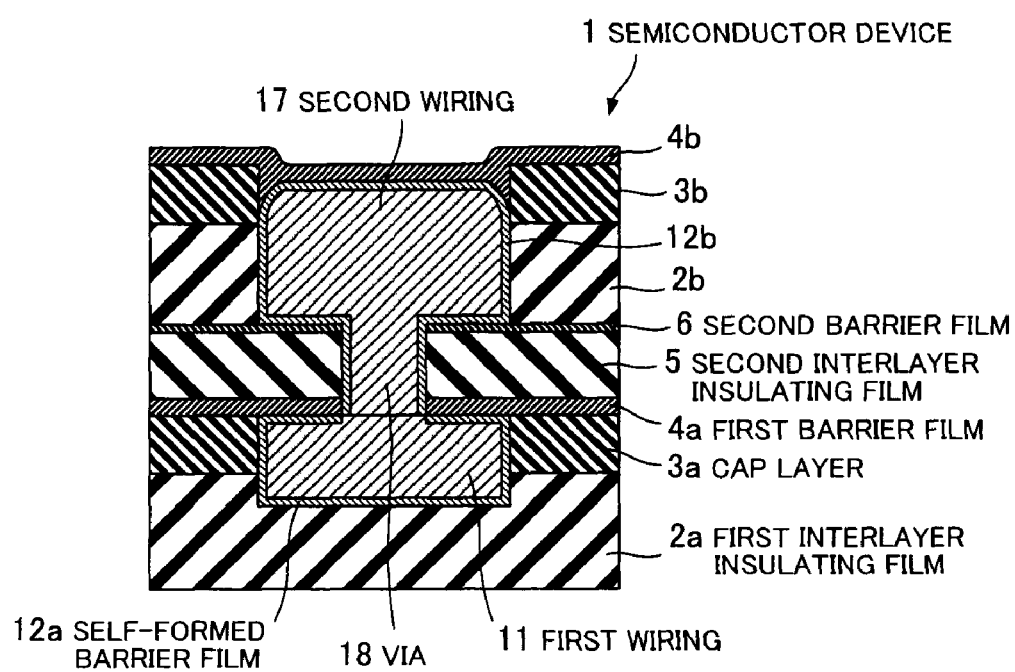
FIG. 7 is a cross sectional views showing a process for fabricating a wiring structure in a semiconductor device according to a sixth embodiment.

FIG. 7 is a cross sectional view showing a process for fabricating a wiring structure in a semiconductor device according to the sixth embodiment.

Firstly, there is performed up to the process for forming the first barrier film 4b on the second wiring 17 and the cap layer 3b as shown in FIG. 3D in the third embodiment. However, in this embodiment, it is assumed that the quantity of predetermined metallic element α enough to permit the self-formed barrier film 12b to be formed on the upper surface of the second wiring 17 remains in the second wiring 17.

Next, as shown in FIG. 7, the heat treatment, for example, is performed at 200 to 400° C. for 5 to 60 minutes, preferably, in the reduction ambient atmosphere, which results in that the reaction occurs between the second wiring 17 and the first barrier film 4b on the second wiring 17, thereby forming the self-formed barrier film 12b on the upper surface of the second wiring 17.

When the self-formed barrier film 12b is made of $MnSi_xO_y$, the self-formed barrier film 12b is formed on the upper surface of the second wiring 17 from Mn remaining in the second wiring 17, and Si and O contained in the first barrier film 4b.

Moreover, while not illustrated in the figure, the insulating film and the like are formed as the upper layers, thereby forming the semiconductor device 1.

According to the sixth embodiment, forming the self-formed barrier film 12b even on the upper surface of the second wiring 17 makes it possible to further reduce the leakage current as compared with that in the third embodiment.

It is noted that the first wiring 11 can be formed by utilizing the same method as that for the second wiring 17.

Seventh Embodiment

A seventh embodiment is different from the first or second embodiment in that the self-formed barrier film 12b is formed even on the upper surface of the second wiring 17. It is noted that the same respects, such as the constitutions and the like of other portions, as those in the first or second embodiment are omitted here in their descriptions for the sake of simplicity.

Figure 8A:
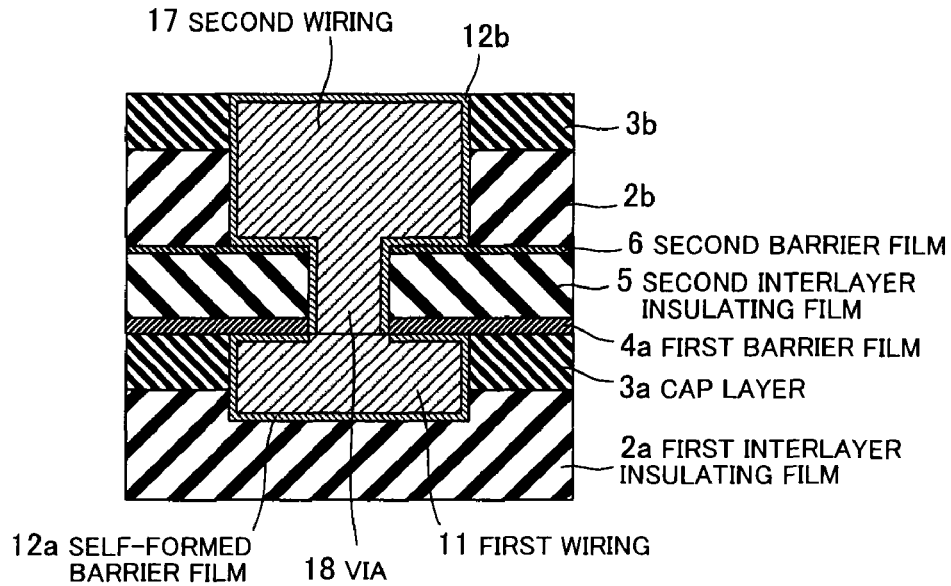
FIGS. 8A and 8B are respectively cross sectional views showing processes for fabricating a wiring structure in a semiconductor device according to a seventh embodiment.
Figure 8B:
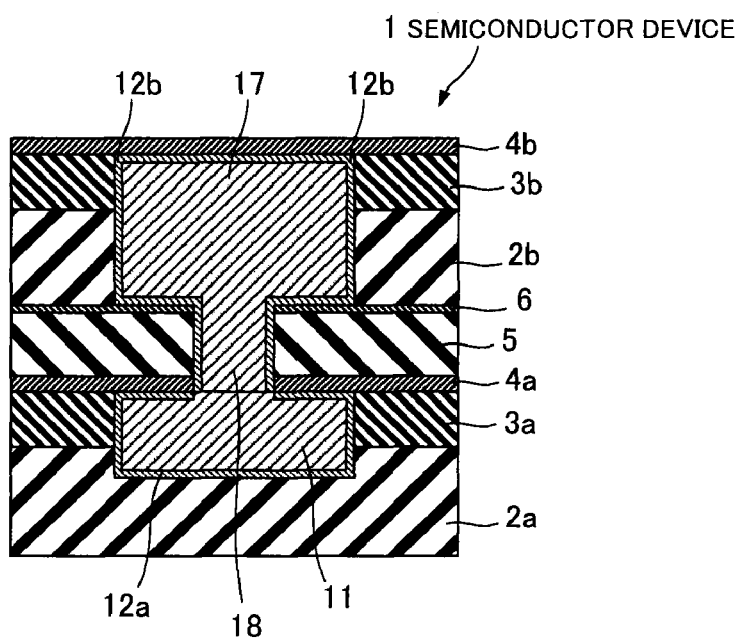

FIGS. 8A and 8B are respectively cross sectional views showing processes for fabricating a wiring structure in a semiconductor device according to the seventh embodiment.

Firstly, there is performed up to the process for performing the CMP with the cap layer 3b as the stopper, thereby flattening the wiring formation film 15 until the cap layer 3b is exposed as shown in FIG. 1G in the first embodiment or as shown in FIG. 2E in the second embodiment. However, in this embodiment, it is assumed that the quantity of predetermined metallic element α enough to permit the self-formed barrier film 12b to be formed on the upper surface of the second wiring 17.

Next, as shown in FIG. 8A, after plasma processing using ammonia or the like is executed under a reduced pressure to remove a copper oxide film (not shown) on the upper surface of the second wiring 17, the upper surface of the second wiring 17 is exposed to each of a reducing gas and a silane gas. As a result, Si penetrates into only an uppermost portion of the upper surface of the second wiring 17. Thus, the heat treatment, for example, is performed at 200 to 400° C. for 5 to 60 minutes in the oxidation ambient atmosphere, thereby forming the self-formed barrier film 12b on the upper surface of the second wiring 17.

When the self-formed barrier film 12b is made of $MnSi_xO_y$, the self-formed barrier film 12b is formed on the upper surface of the second wiring 17 from Mn and Si contained in the second wiring 17, and O contained in the oxidation ambient atmosphere.

Next, as shown in FIG. 8B, the first barrier film 4b is formed on the second wiring 17 and the cap layer 3b. Moreover, while not illustrated in the figure, the insulating film and the like are formed as the upper layers, thereby forming the semiconductor device 1.

According to the seventh embodiment, forming the self-formed barrier film 12b even on the upper surface of the second wiring 17 makes it possible to further reduce the leakage current as compared with that in the first or second embodiment.

It is noted that the first wiring 11 can be formed by utilizing the same method as that for the second wiring 17.

Eighth Embodiment

An eighth embodiment is different from the third embodiment in that the self-formed barrier film 12b is formed even on the upper surface of the second wiring 17. It is noted that the same respects, such as the constitutions and the like of other portions, as those in the third embodiment are omitted here in their descriptions for the sake of simplicity.

Figure 9A:
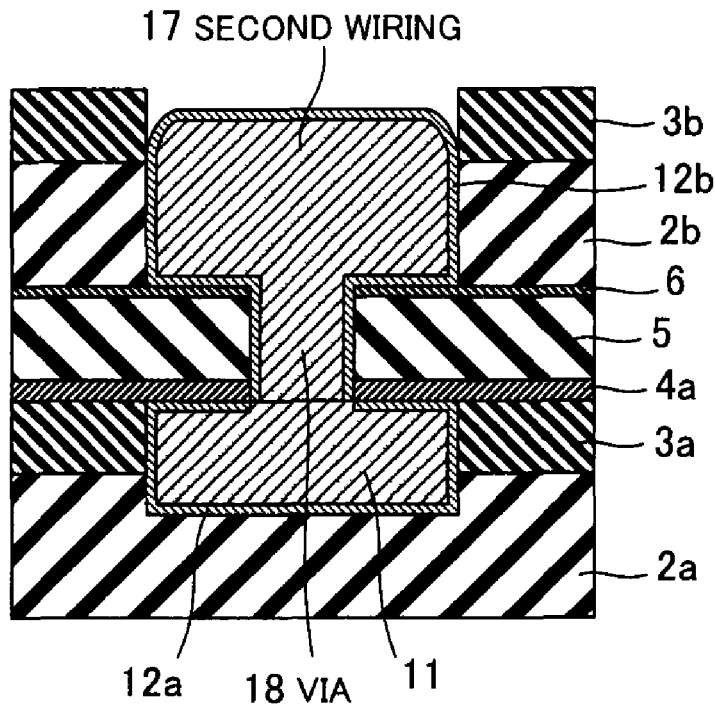
FIGS. 9A and 9B are respectively cross sectional views showing processes for fabricating a wiring structure in a semiconductor device according to an eighth embodiment.
Figure 9B:
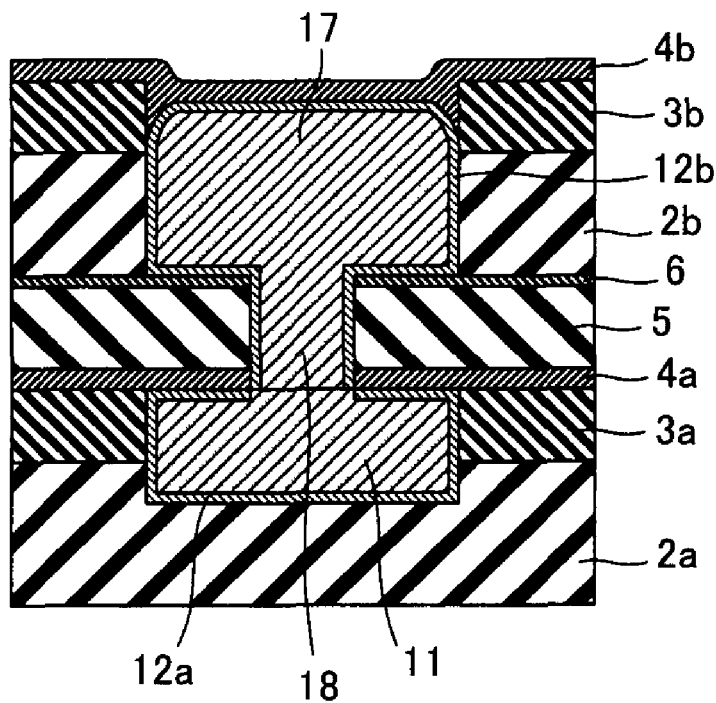

FIGS. 9A and 9B are respectively cross sectional views showing processes for fabricating a wiring structure in a semiconductor device according to the eighth embodiment.

Firstly, there is performed up to the process for removing the unreacted metallic oxide film 16 as shown in FIG. 3C in the third embodiment. However, in this embodiment, it is assumed that the quantity of predetermined metallic element α enough to permit the self-formed barrier film 12b to be formed on the upper surface of the second wiring 17 remains in the second wiring 17.

Next, as shown in FIG. 9A, after the plasma processing using ammonia or the like is executed under the reduced pressure to remove the copper oxide film (not shown) on the upper surface of the second wiring 17, the upper surface of the second wiring 17 is exposed to each of the reducing gas and the silane gas. As a result, Si penetrates into only the uppermost portion of the upper surface of the second wiring 17. Thus, the heat treatment, for example, is performed at 200 to 400° C. for 5 to 60 minutes in the oxidation ambient atmosphere, thereby forming the self-formed barrier film 12b on the upper surface of the second wiring 17.

When the self-formed barrier film 12b is made of $MnSi_xO_y$, the self-formed barrier film 12b is formed on the upper surface of the second wiring 17 from Mn and Si contained in the second wiring 17, and O contained in the oxidation ambient atmosphere.

Next, as shown in FIG. 9B, the first barrier film 4b is formed on the self-formed barrier film 12b on the second wiring 17, and the cap layer 3b. Moreover, while not illustrated in the figure, the insulating film and the like are formed as the upper layers, thereby forming the semiconductor device.

According to the eighth embodiment, forming the self-formed barrier film 12b even on the upper surface of the second wiring 17 makes it possible to further reduce the leakage current as compared with that in the third embodiment.

It is noted that the first wiring 11 can be formed by utilizing the same method as that for the second wiring 17.

Other Embodiments

It should be noted that the present invention is not intended to be limited to the embodiments described above, and the various changes can be implemented by those skilled in the art without departing from the gist of the invention. For example, the present invention can also be applied to any of wiring structures other than the dual damascene wiring structure as shown in each of the embodiments described above. For example, the present invention may also be applied to a wiring structure in which wirings/vias covered with the self-formed barrier film are individually formed.

In addition, the constituent elements of the above-mentioned embodiments can be arbitrarily combined with one another without departing from the gist of the invention.

What is claimed is:

1. A method of fabricating a semiconductor device, comprising:

forming a precursor film containing a predetermined metallic element on a surface of a recess portion formed in an insulating film on a semiconductor substrate;

forming a wiring formation film on the precursor film;

performing a heat treatment in an oxidation ambient atmosphere to cause the precursor film and the insulating film to react with each other, thereby forming a self-formed barrier film containing a compound which contains the predetermined metallic element and a constituent element of the insulating film as a basic constituent in a boundary between the precursor film and the insulating film, and moving an unreacted predetermined metallic element into the wiring formation film through diffusion to cause the unreacted predetermined metallic element to react with oxygen contained in the oxidation ambient atmosphere, thereby precipitating an unreacted metallic oxide film including the predetermined metallic element to a surface of the wiring formation film;

removing the unreacted metallic oxide film;

forming the same material as that of the wiring formation film on the wiring formation film after removing; and flattening the wiring formation film until a portion of the insulating film located outside the recess portion is exposed.

2. The method of fabricating a semiconductor device according to claim 1, wherein the wiring formation film is provided on the precursor film so that its thickness from a top surface of a portion of the insulating film located outside the recess portion falls in a range of 10 to 110 nm.

3. The method of fabricating a semiconductor device according to claim 1, wherein the predetermined metallic element is one of Mn, V, Zn, Nb, Zr, Cr, Y, Tc and Re.

4. The method of fabricating a semiconductor device according to claim 1, wherein the wiring formation film is a Cu film, the precursor film is made of an alloy containing the predetermined metallic element and Cu, the insulating film contains Si, and the self-formed barrier film is made of an oxide containing the predetermined metallic element and Si.

5. The method of fabricating a semiconductor device according to claim 1, further comprising:

forming a barrier film on the wiring formation film after the wiring formation film is flattened; and performing a heat treatment to cause the barrier film and the wiring formation film to react with each other, thereby forming the self-formed barrier film containing the compound containing the predetermined metallic element and a constituent element of the barrier film as the basic constituent in the boundary between the barrier film and the wiring formation film.

6. The method of fabricating a semiconductor device according to claim 1, further comprising:

exposing the wiring formation film to at least a silane gas after the wiring formation film is flattened; and performing a heat treatment in an oxidation ambient atmosphere to cause the wiring formation film exposed to the silane gas to react with oxygen in the oxidation ambient atmosphere, thereby forming the self-formed barrier film containing the compound containing the predetermined metallic element and Si as the basic constituent on an upper surface of the wiring formation film.

7. The method of fabricating a semiconductor device according to claim 1, wherein a thickness of the same material as that of the wiring formation film, formed on the wiring formation film is larger than that of the unreacted metallic oxide film.

8. The method of fabricating a semiconductor device according to claim 1, wherein the unreacted metallic oxide film is removed by etching.

* * * * *